(12) United States Patent
Choi et al.

(10) Patent No.: US 12,525,567 B2
(45) Date of Patent: Jan. 13, 2026

(54) SEMICONDUCTOR DEVICE AND METHOD OF FORMING CLIP BOND HAVING MULTIPLE BOND LINE THICKNESSES (71) Applicant: UTAC Headquarters Pte. Ltd., Singapore (SG)

(72) Inventors: Hyung Mook Choi, Freemont, CA (US); Edgardo R. Hortaleza, Pacifica, CA (US)

(73) Assignee: UTAC Headquarters Pte. Ltd., Singapore (SG)

( * ) Notice: Subject to any disclaimer, the term of this patent is extended or adjusted under 35 U.S.C. 154(b) by 949 days.

(21) Appl. No.: 17/644,143

(22) Filed: Dec. 14, 2021

(65) Prior Publication Data

US 2022/0208716 A1 Jun. 30, 2022

Related U.S. Application Data (60) Provisional application No. 63/132,556, filed on Dec. 31, 2020.

(51) Int. Cl.
*H01L 23/00* (2006.01)
*H01L 23/495* (2006.01)
*H01L 25/00* (2006.01)

(52) U.S. Cl.
CPC ........ *H01L 24/37* (2013.01); *H01L 23/49575* (2013.01); *H01L 24/35* (2013.01); *H01L 24/40* (2013.01); *H01L 25/50* (2013.01); *H01L 23/49513* (2013.01); *H01L 24/41* (2013.01); *H01L 24/73* (2013.01); *H01L 24/84* (2013.01); *H01L 24/92* (2013.01); *H01L 2224/351* (2013.01); *H01L 2224/37013* (2013.01); *H01L 2224/40137* (2013.01);

(Continued)

(58) Field of Classification Search
CPC . H01L 2224/84375; H01L 2224/40475; H01L 2224/40175; H01L 2224/40137; H01L 2224/37013; H01L 2224/351; H01L 24/49575; H01L 24/50; H01L 24/40; H01L 24/35; H01L 24/37
See application file for complete search history.

(56) References Cited

U.S. PATENT DOCUMENTS 9,620,440 B1\* 4/2017 Shibuya ............ H01L 25/50
2007/0181997 A1\* 8/2007 Ahr ................. H01L 24/97
257/E23.092

(Continued)

*Primary Examiner* — Khaja Ahmad
(74) *Attorney, Agent, or Firm* — Robert D. Atkins; PATENT LAW GROUP (57) ABSTRACT

A semiconductor device has a leadframe and a first electrical component disposed over the leadframe. A clip bond is disposed over the first electrical component. The clip bond has a plurality of recesses each having a different depth. A first recess is proximate to a first distal end of the first electrical component, and a second recess is proximate to a second distal end of the first electrical component opposite the first distal end of the first electrical component. A depth of the first recess is different from a depth of the second recess. A third recess is over a surface of the first electrical component. A depth of the third recess is different from the depth of the first recess and the depth of the second recess. A second electrical component is disposed over the leadframe. The clip bond extends over the second electrical component.

17 Claims, 10 Drawing Sheets

(52) U.S. Cl.
CPC ............... *H01L 2224/40175* (2013.01); *H01L 2224/40475* (2013.01); *H01L 2224/41175* (2013.01); *H01L 2224/73263* (2013.01); *H01L 2224/84375* (2013.01); *H01L 2224/92246* (2013.01)

(56) References Cited

U.S. PATENT DOCUMENTS

| | | | | |
|---|---|---|---|---|
| 2010/0127383 | A1* | 5/2010 | Oka | H01L 24/40 |
| | | | | 257/692 |
| 2010/0258923 | A1* | 10/2010 | Cruz | H01L 24/39 |
| | | | | 257/676 |
| 2013/0241047 | A1* | 9/2013 | Omae | H01L 24/40 |
| | | | | 257/712 |
| 2014/0284809 | A1* | 9/2014 | Yoneguchi | H01L 24/13 |
| | | | | 257/773 |

* cited by examiner

SEMICONDUCTOR DEVICE AND METHOD OF FORMING CLIP BOND HAVING MULTIPLE BOND LINE THICKNESSES

CLAIM OF DOMESTIC PRIORITY

The present application claims the benefit of U.S. Provisional Application No. 63/132,556, filed Dec. 31, 2020, which application is incorporated herein by reference.

FIELD OF THE INVENTION

The present invention relates in general to semiconductor devices and, more particularly, to a semiconductor device and method of forming a clip bond having a plurality of bond line thicknesses.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor die can be mounted to a leadframe for electrical interconnect and encapsulated for structural support and environmental protection. The leadframe may use a clip bond for electrical interconnect. The clip bond extends over the leadframe and semiconductor die. The placement of the clip bond is susceptible to variation, as in tilting to an uneven position over the semiconductor die. The uneven position of the clip bond can cause breakage at the electrical interconnect or cracking of the semiconductor die, particularly in areas having a large bond line thickness (BLT). Placement variation of the clip bond reduces package reliability and increases manufacturing costs.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
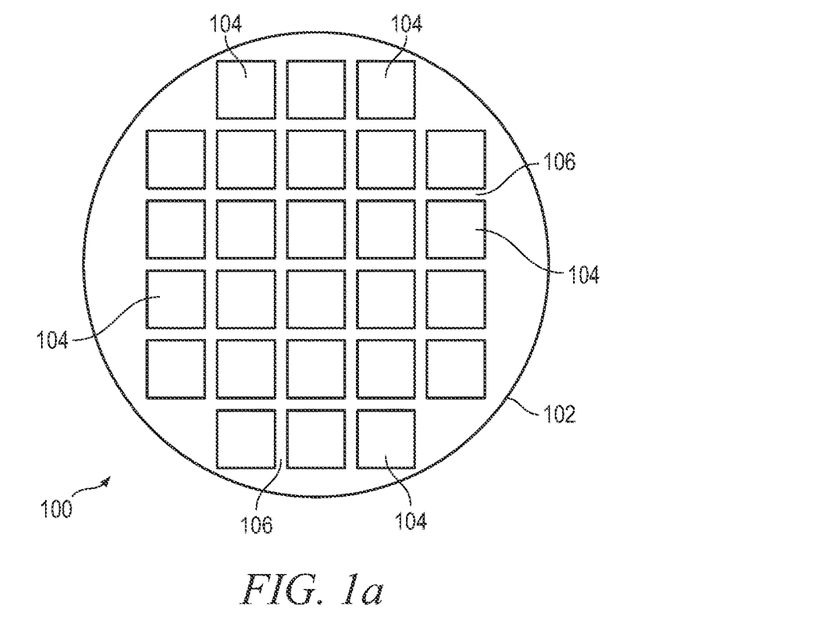
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
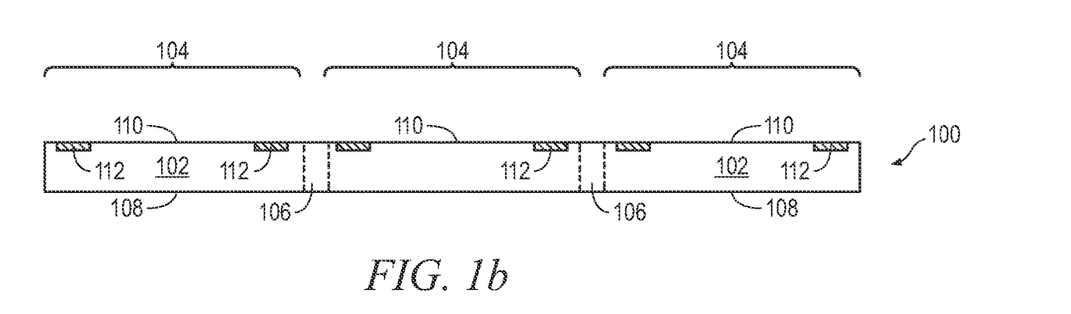

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), platinum (Pt), or other suitable electrically conductive material. Conductive layer 112 operates as contact pads electrically connected to the circuits on active surface 110.

Figure 1C:
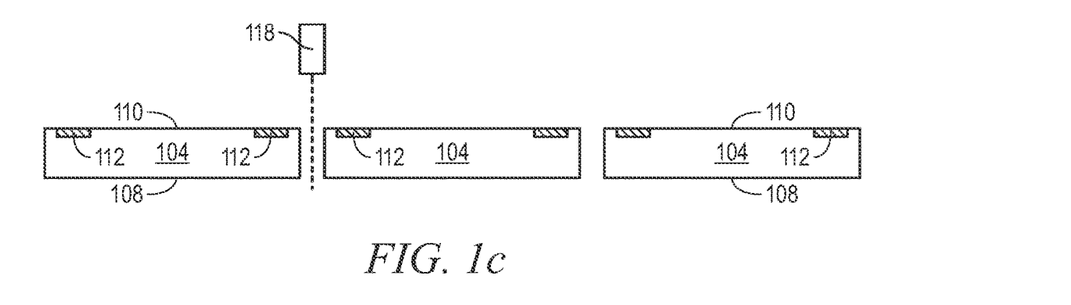

In FIG. 1c, semiconductor wafer 100 is singulated through saw street 106 using a saw blade or laser cutting tool 118 into individual semiconductor die 104. Post singulation semiconductor die 104 has an exposed side surface 120 and exposed side surface 122 adjacent to side surface 120. The individual semiconductor die 104 can be inspected and electrically tested for identification of known good die (KGD) post singulation.

Figure 2A:
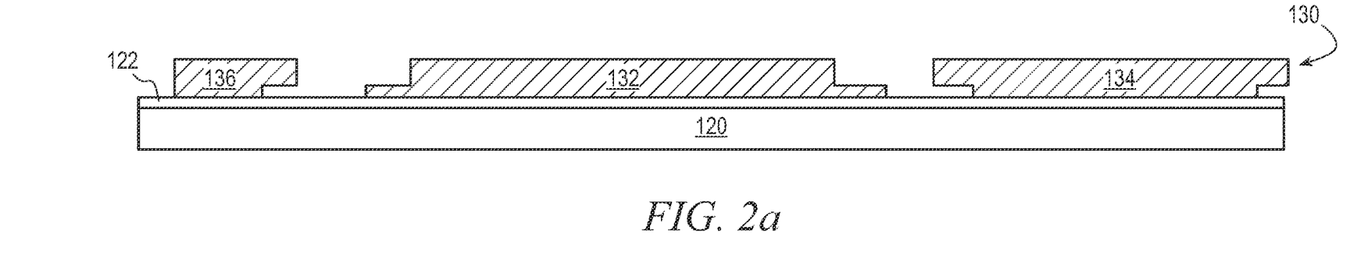
FIGS. 2a-2j illustrate a process of forming a leadframe and semiconductor die with a clip bond having multiple recess depths for electrical interconnect.

FIGS. 2a-2j illustrate a process of forming a clip bond having a plurality of bond line thicknesses. FIG. 2a shows a cross-sectional view of a portion of a carrier or temporary substrate 120 containing sacrificial base material such as silicon, polymer, beryllium oxide, glass, or other suitable low-cost, rigid material for structural support. An interface layer or double-sided tape 122 is formed over substrate 120 as a temporary adhesive bonding film, etch-stop layer, or thermal release layer.

Leadframe 130 is positioned over substrate 120 for mounting to the substrate using a pick and place operation. Leadframe 130 includes a first die mounting site or flag 132, second die mounting site or flag 134, and a plurality of lead fingers 136. Leadframe 130 can be made from Au, Ag, Ni, Pt, Cu, Cu alloys (including one or more elements of nickel, iron, zinc, tin, chromium, silver, and phosphorous), or other suitable conductive materials. Leadframe 130 can be a pre-plated leadframe (PPF) or laminated leadframe. Leadframe 130 can be stamped, etched, or 3D laser printed into any shape corresponding to a leadframe form and function. Leadframe 130 provides structural support and electrical interconnection for electrical components, such as semiconductor die 104. FIG. 2a shows leadframe 130 mounted to substrate 120 using the adhesive property of interface layer 122.

Figure 2B:
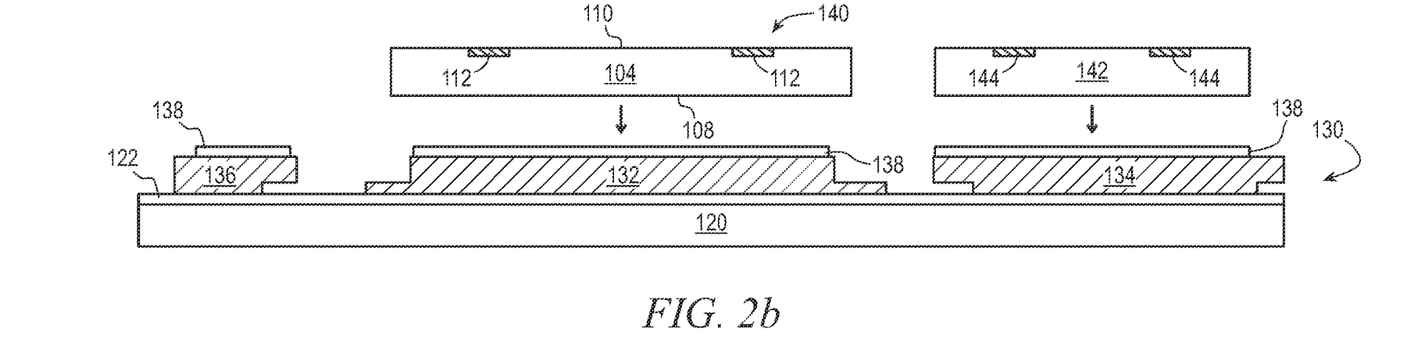
Figure 2C:
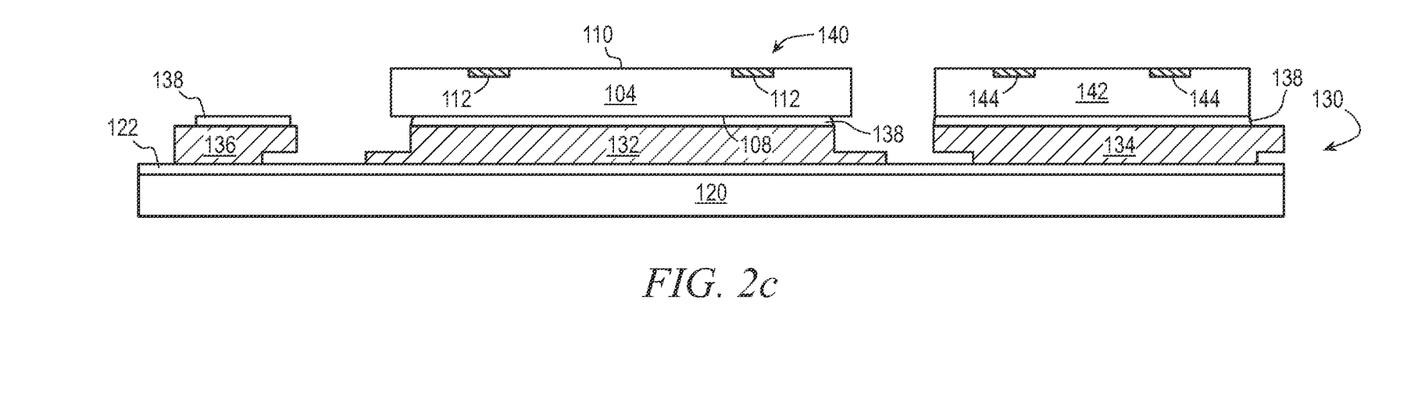

In FIG. 2b, adhesive layer 138 is deposited on flag 132, flag 134, and lead finger 136. Electrical component 140 is positioned over leadframe 130 using a pick and place operation. For example, electrical component 140 can be semiconductor die 104 from FIG. 1c with back surface 108 oriented toward flag 132 of leadframe 130. Electrical component 142 is positioned over leadframe 130 using a pick and place operation. For example, electrical component 142 can be made similar to semiconductor die 104 from FIG. 1c, although with a different form and function, with the back surface oriented toward flag 134 of leadframe 130. Electrical component 140 and electrical component 142 are secured to flag 132 and flag 134 with adhesive 138, respectively, as shown in FIG. 2c.

Figure 2D:
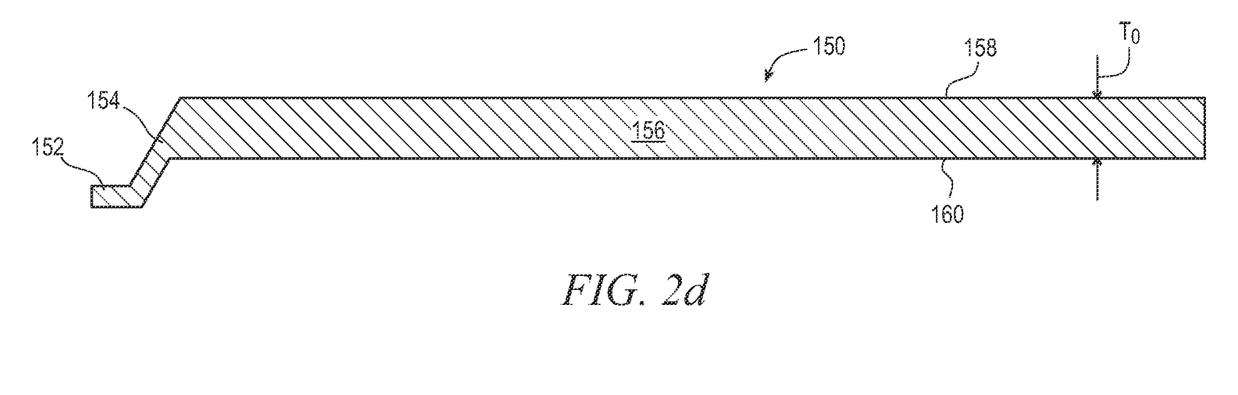
Figure 2E:
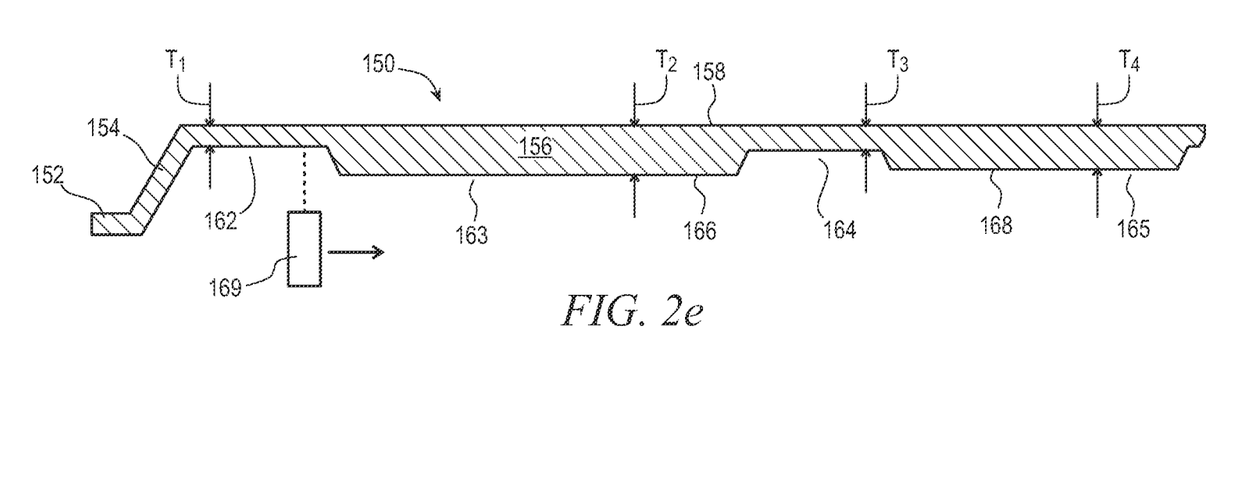

FIG. 2d shows clip bond 150 including clip foot 152, angled member 154 and horizontal member 156. Horizontal member 156 has an initial of thickness T0 has a range of 0.137-0.237 mm between surface 158 and surface 160. Clip bond 150 can be made with Au, Ag, Ni, Pt, Cu, Cu alloys (including one or more elements of nickel, iron, zinc, tin, chromium, silver, and phosphorous), or other suitable conductive materials. In FIG. 2e, a portion of surface 160 is removed or reformed to provide a plurality of recesses or notches 162, 163, 164, and 165 along horizontal member 156 making die contacts 166 and 168 integrated with the horizontal member. For example, clip bond 150 can be stamped, etched, laser direct ablation (LDA) using laser 169, or 3D laser printed into any shape with corresponding to form and function. After altering surface 160, the thickness of horizontal member 156 proximate to recess 162 has a range of 0.077-0.177 mm. The thickness of horizontal member 156 proximate to recess 163 has a range of 0.137-0.237 mm. The thickness of horizontal member 156 proximate to recess 164 has a range of 0.127-0.227 mm. The thickness of horizontal member 156 proximate to recess 165 has a range of 0.132-0.232 mm.

Figure 2F:
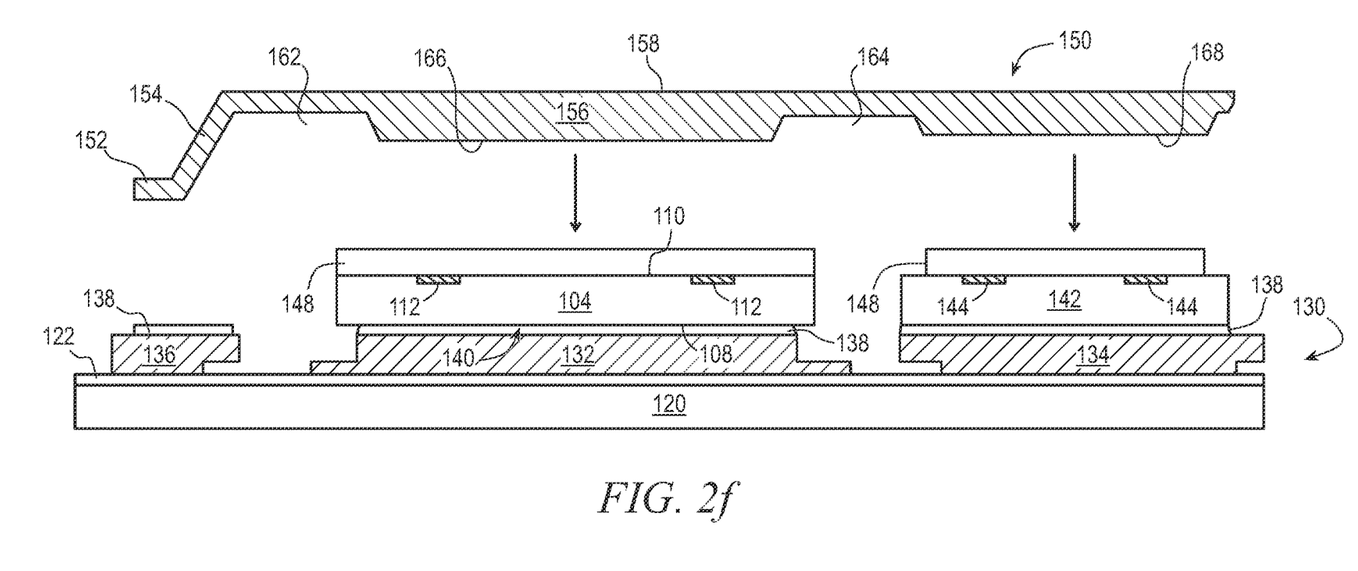

In FIG. 2f, conductive paste 148 is deposited on the active surfaces of electrical component 140 and electrical component 142 to make electrical connection to a portion of conductive layer 112 and a portion of conductive layer 144. Clip bond 150 is positioned over leadframe 130 and electrical components 140 and 142.

Figure 2G:
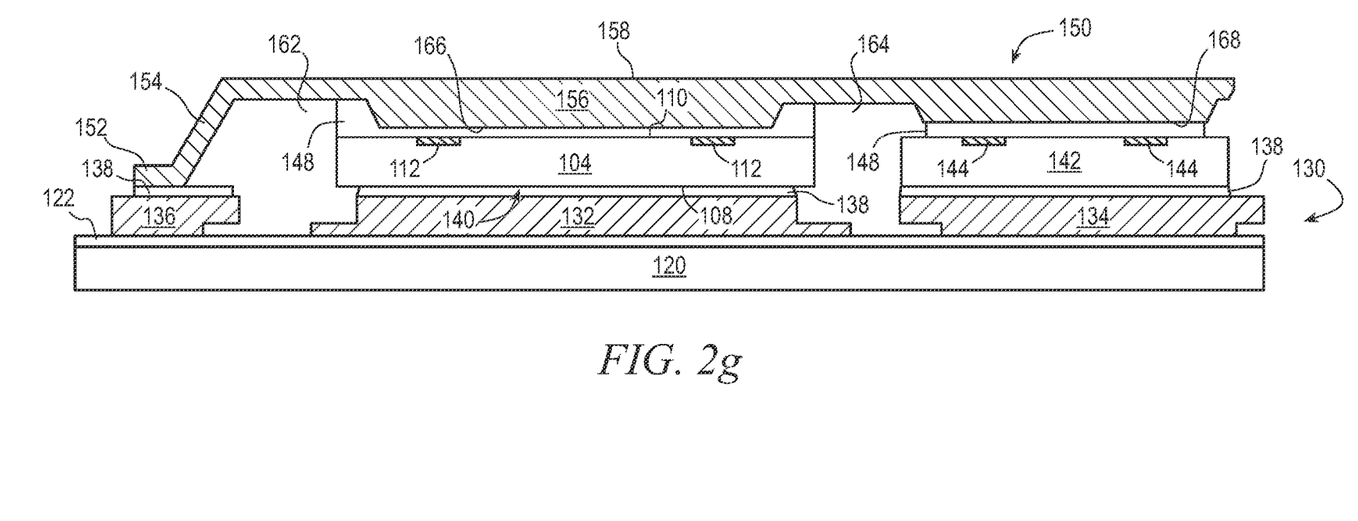
Figure 2H:
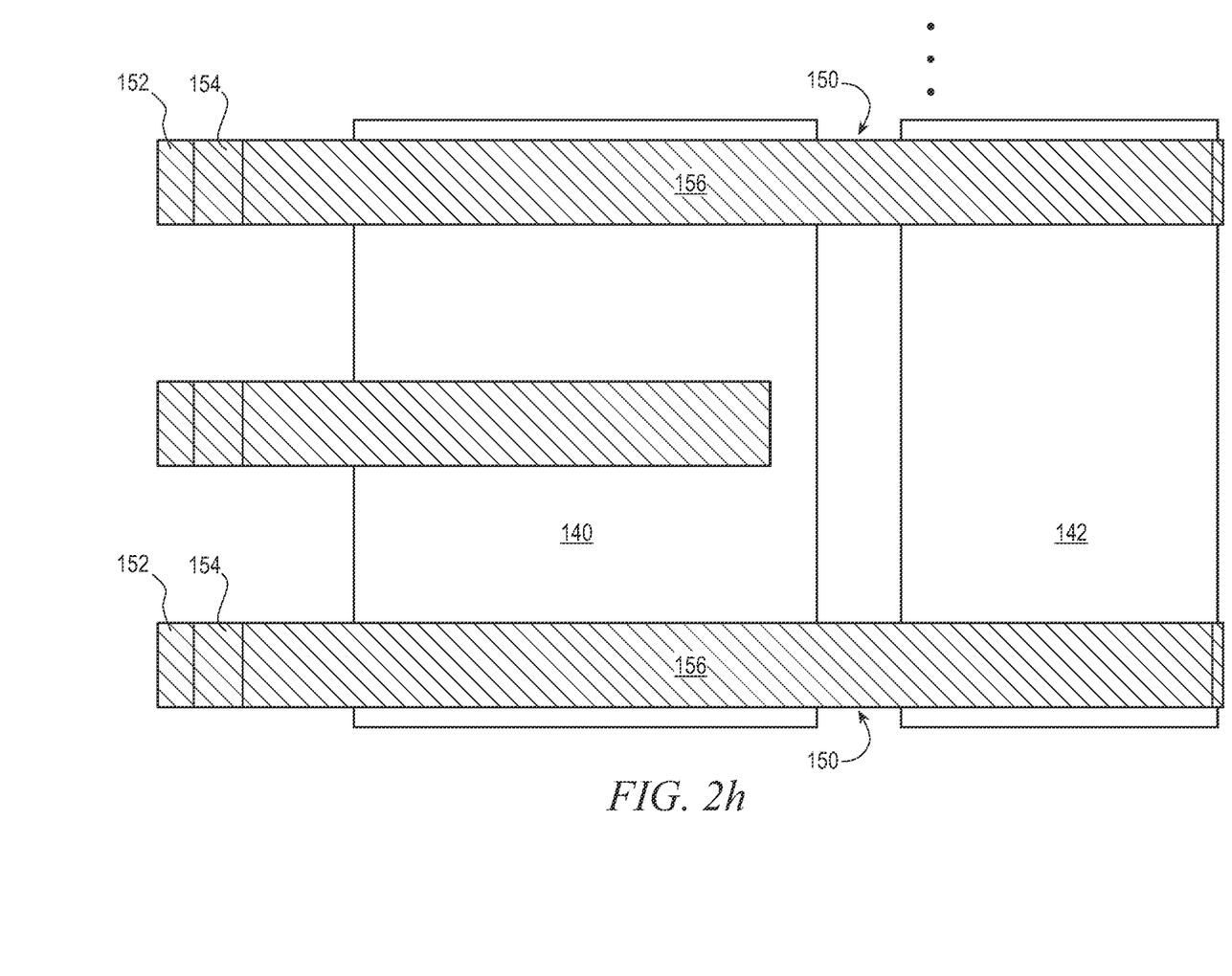

FIG. 2g shows clip bond 150 in place with clip foot 152 making mechanical and electrical connection to lead finger 134 and die contacts 166-168 making mechanical and electrical connection to conductive layers 112 and 144 of electrical components 140 and 142, respectively. Conductive paste 148 is cured to form a permanent mechanical and electrical connection between electrical components 140-142 and die contacts 166-168 and between clip foot 152 and lead finger 134. A portion of conductive paste 148 may be pressed into recesses 162 and 164. Clip bond 150 provides structural support and electrical interconnection between electrical components 140 and 142 and lead finger 134 of leadframe 130. Any number of clip bonds 150 can be connected to electrical components 140-142. FIG. 2h shows a top view of electrical components 140-142 with a plurality of clip bonds 150.

Figure 2I:
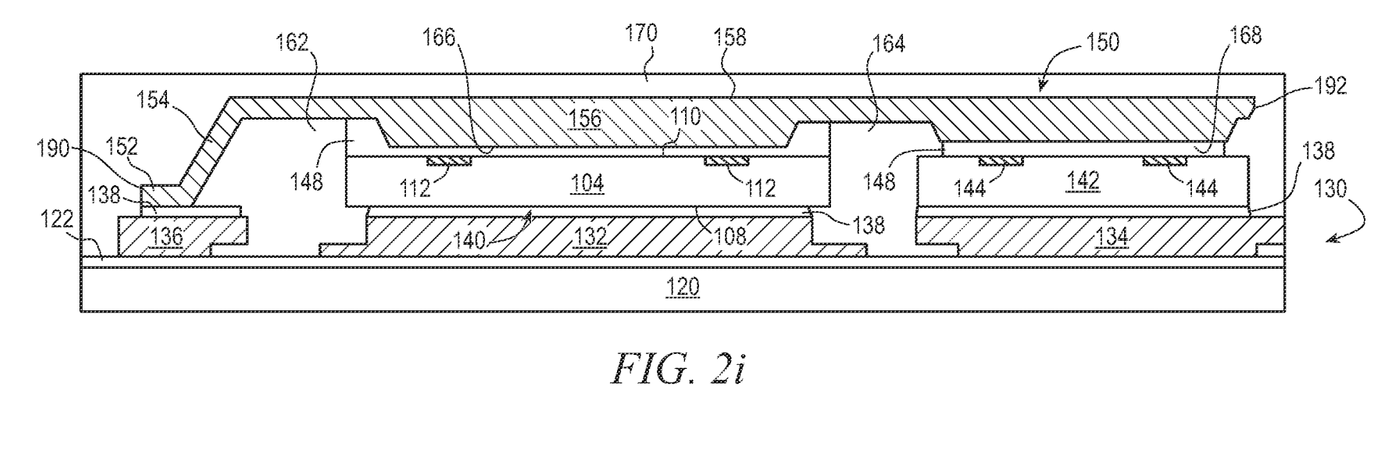

In FIG. 2i, encapsulant or molding compound 170 is deposited over and around clip bond 150, leadframe 130, and electrical components 140-142 using a paste printing, compressive molding, transfer molding, liquid encapsulant molding, vacuum lamination, spin coating, film assisted molding (FAM), or other suitable applicator. Encapsulant 170 can be polymer composite material, such as epoxy resin with filler, epoxy acrylate with filler, or polymer with proper filler. Encapsulant 170 is non-conductive, provides structural support, and environmentally protects the semiconductor device from external elements and contaminants.

Figure 2J:
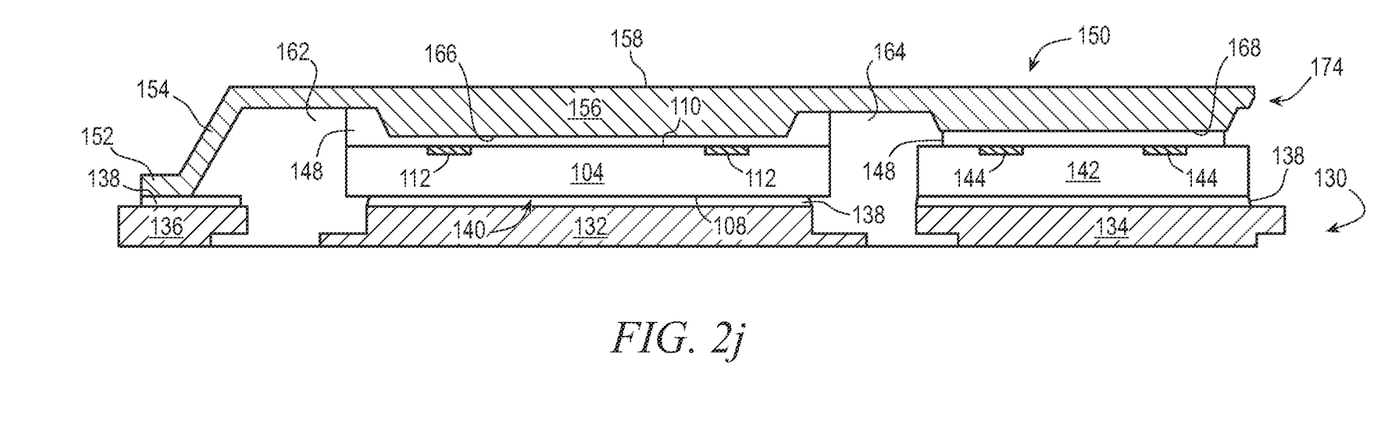

In FIG. 2j, temporary substrate 120 and interface layer 122 are removed by chemical etching, mechanical peel-off, chemical mechanical planarization (CMP), mechanical grinding, thermal bake, laser scanning, or wet stripping, leaving semiconductor package 174 with electrical components 140-142 mounted to leadframe 130 and clip bond 150 making electrical connection between the electrical components and lead finger 136.

Figure 3A:
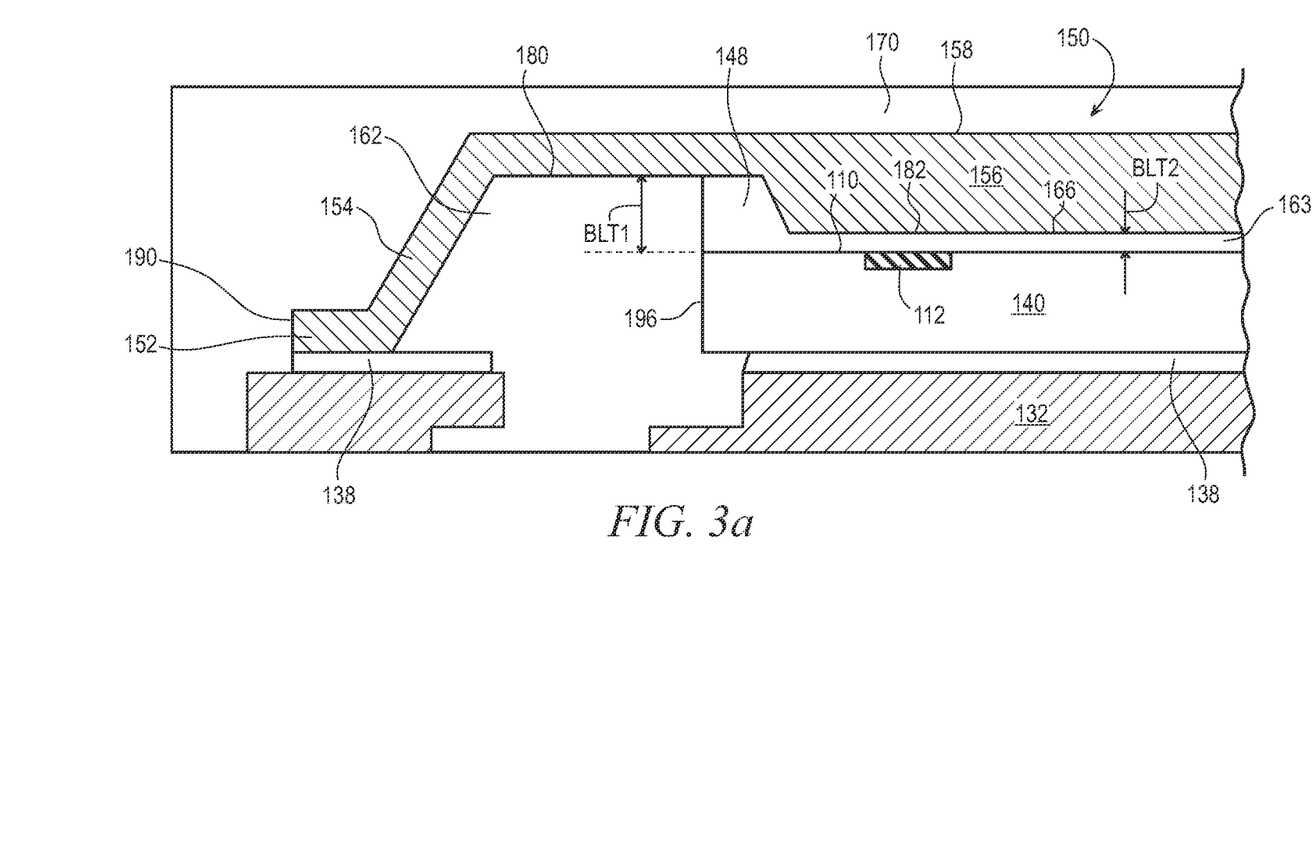
FIGS. 3a-3b illustrate further detail of the multiple recess depths of the clip bond.
Figure 3B:
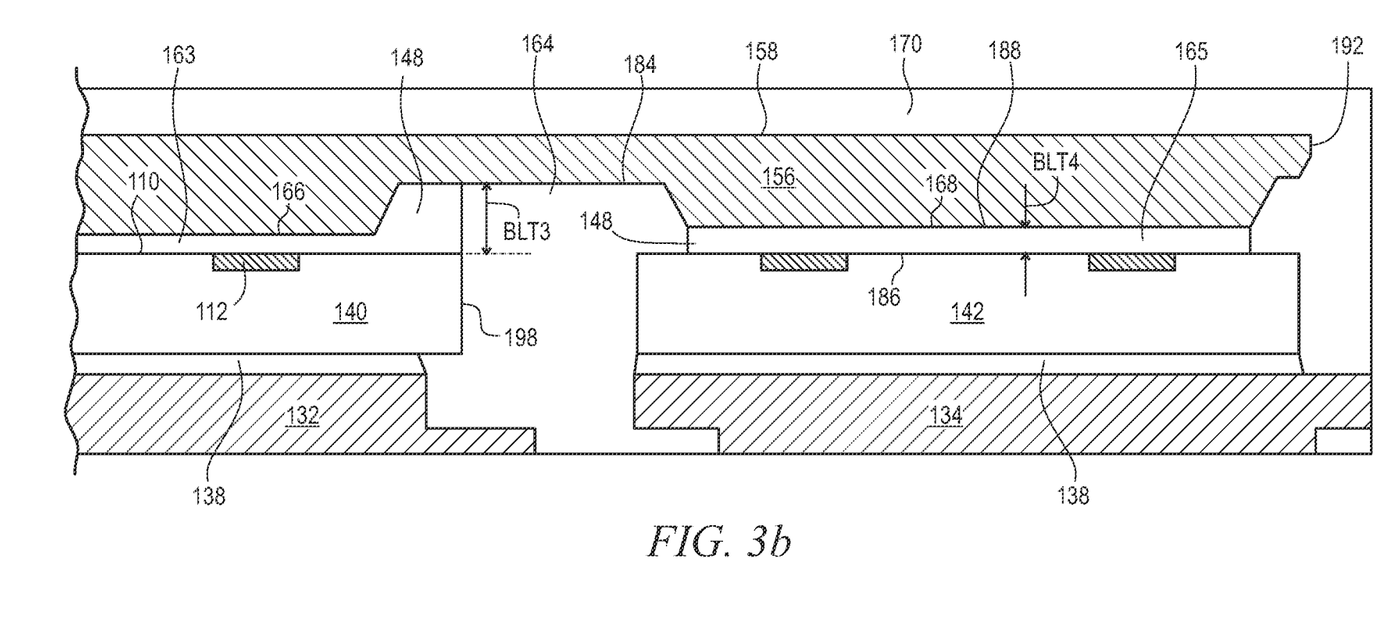

FIG. 3a shows further detail around recesses 162 and 163 of clip bond 150, i.e., the left portion of the clip bond. In particular, the distance between active surface 110 and surface 180 of recess 162 is referred to as the first bond line thickness (BLT 1). The distance between active surface 110 and surface 182 of die contact 166 is referred to as the second bond line thickness (BLT 2). FIG. 3b shows further detail around recess 164 and recess 165 of clip bond 150, i.e., the right portion of the clip bond. In particular, the distance between active surface 110 and surface 184 of recess 164 is referred to as the third bond line thickness (BLT 3). The distance between active surface 186 of electrical component 142 and surface 188 of die contact 168 is referred to as the fourth bond line thickness (BLT 4). Accordingly, clip bond 150 has multiple BLTs between the above connecting surfaces.

Clip bond 150 extending from end 190 to end 192 is predefined to have multiple recess depths into its bottom surface, or multiple thicknesses as measured from surface 158, depending on your preferred frame of reference. Across the bottom surface of clip bond 150, the structure can have three or more different recess depths. A first point of reference is active surface 110 of electrical component 140 in FIG. 3a. Recess 162 is proximate to distal end 196 of electrical component 140. With respect to active surface 110, the depth of recess 162 is BLT 1 with a range of 0.215-0.235 mm. With respect to active surface 110, the depth of surface 182 of die contact 166 is BLT 2 with a value of 0.015 mm. Recess 164 is proximate to distal end 198 of electrical component 140, as shown in FIG. 3b. With respect to active surface 110, the depth of recess 164 is BLT 3 with a range of 0.175-0.195 mm. A second point of reference is active surface 186 of electrical component 142. With respect to active surface 186, the depth of surface 188 of die contact 168 is BLT 4 with a range of 0.170-0.190 mm. The above multiple recess depths can be formed by stamping, etching, LDA, or 3D laser printing, as described in FIGS. 2d-2e.

Figure 4A:
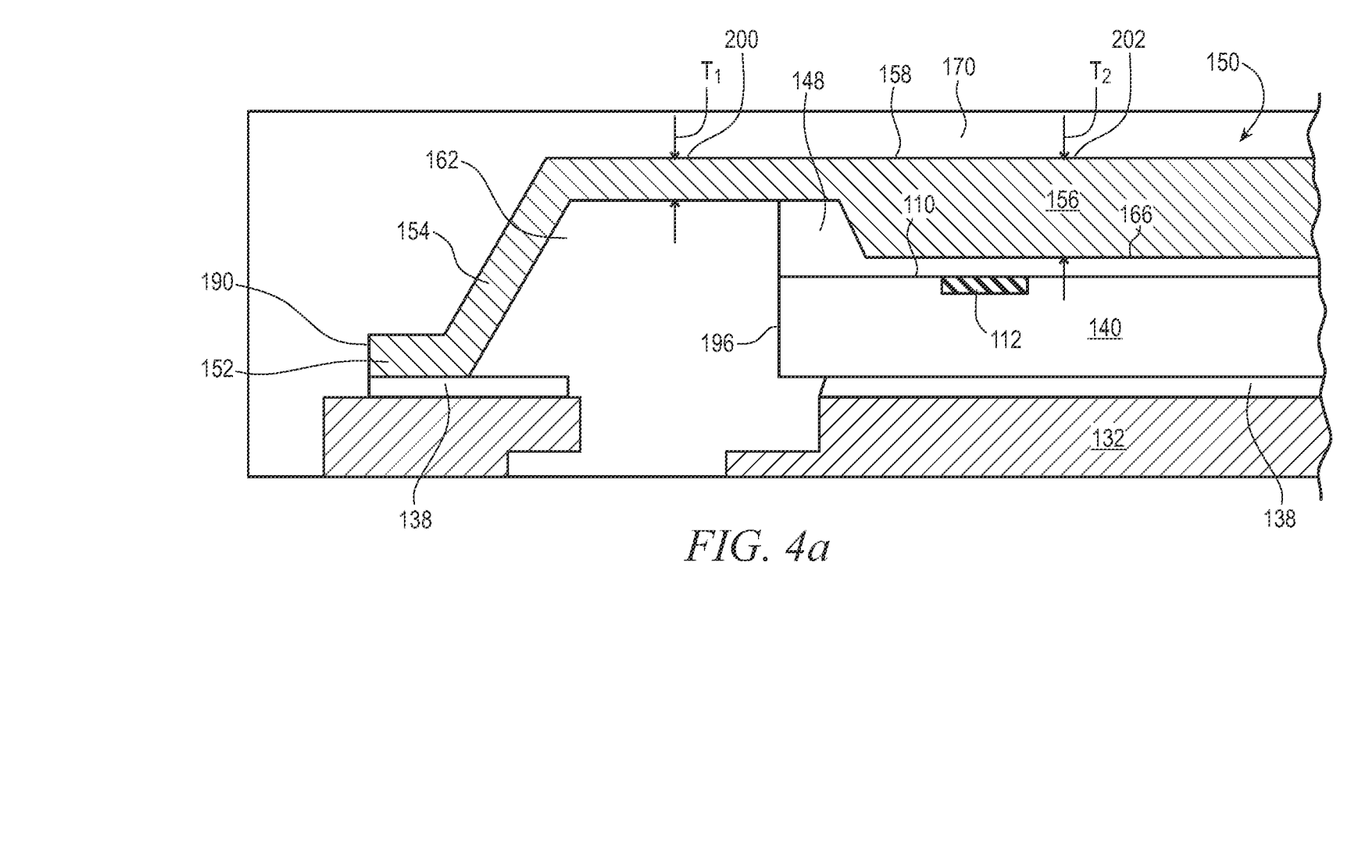
FIGS. 4a-4b illustrate further detail of the multiple thicknesses of the clip bond.
Figure 4B:
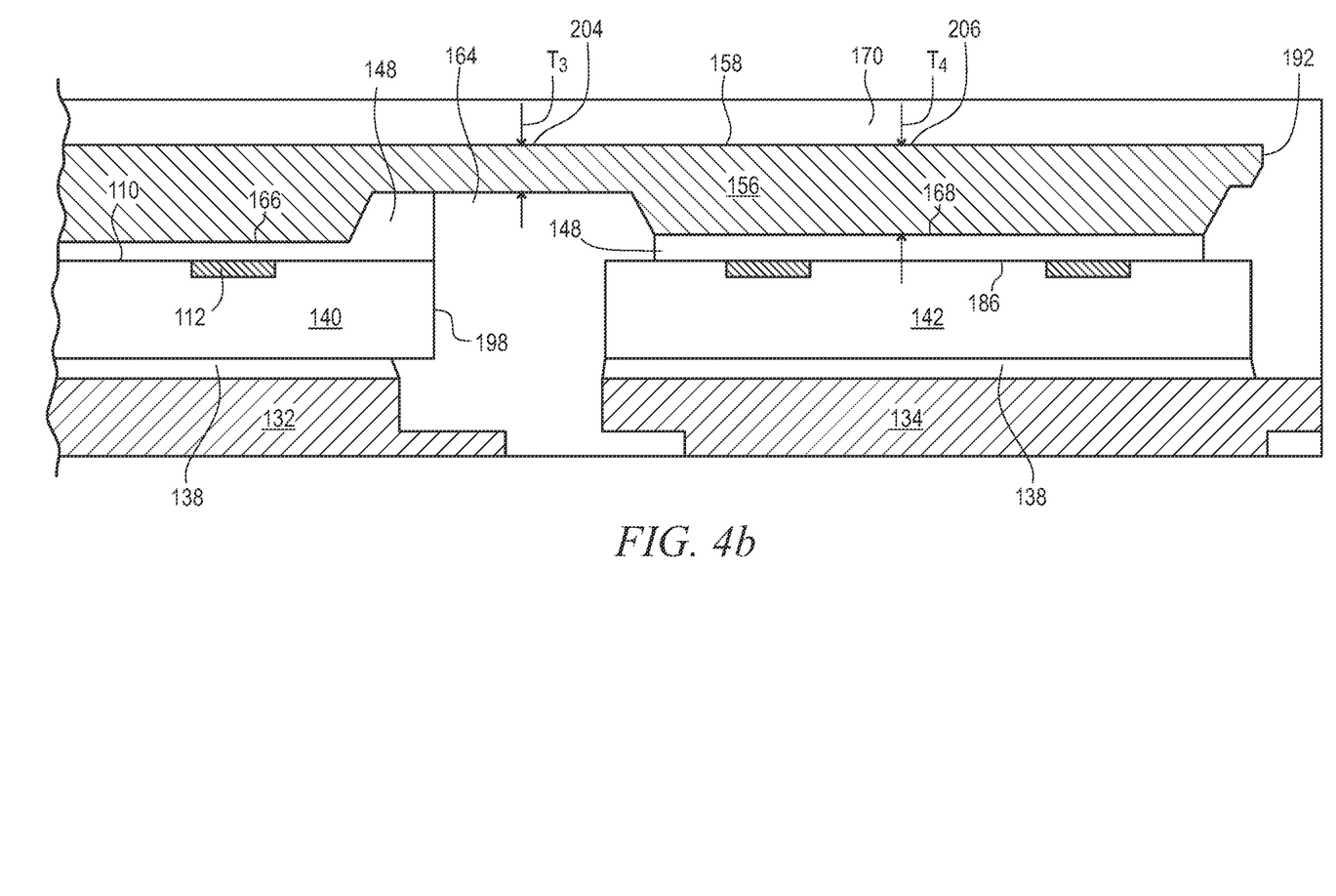

Another way to view clip bond 150 is to consider the thickness of the clip bond at various locations along its length. FIG. 4a shows further detail around recess 162 of clip bond 150, i.e., the left portion of the clip bond. FIG. 4b shows further detail around recess 164 of clip bond 150, i.e., the right portion of the clip bond. In particular, the thickness of clip bond 150 at location 200 along a length of the clip bond proximate to recess 162 as measured from surface 158 is T1, as shown in FIG. 4a. The thickness of clip bond 150 at location 202 along a length of the clip bond as measured from surface 158 is T2. The thickness of clip bond 150 at location 204 along a length of the clip bond proximate to recess 164 as measured from surface 158 is T3, as shown in FIG. 4b. The thickness of clip bond 150 at location 206 along a length of the clip bond as measured from surface 158 is T4. T1-T4 are defined in FIGS. 2d-2e.

By forming clip bond 150 with the above plurality of recess depths or the above plurality of clip bond thicknesses, the clip bond will be robust against variation in placement to reduce tilting and potential cracking or other damage to electrical components 140-142. Semiconductor package 174 exhibits good clip bond placement control and more reliability with fewer defects due to placement variation. Clip bond 150 has a larger contact area with less resistance and higher peak current rating.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a leadframe;
a first electrical component disposed over the leadframe; and
a clip bond disposed over the first electrical component, wherein the clip bond includes a first recess proximate to a first distal end of the first electrical component and a second recess proximate to a second distal end of the first electrical component opposite the first distal end of the first electrical component, wherein a depth of the first recess in a range of 0.215-0.235 mm measured vertically from a top surface of the first electrical component to a first bottom surface of the clip bond directly above the first distal end of the first electrical component is greater than a depth of the second recess in a range of 0.170-0.190 mm measured vertically from the top surface of the first electrical component to a second bottom surface of the clip bond directly above the second distal end of the first electrical component.

2. The semiconductor device of claim 1, further including a second electrical component disposed over the leadframe, wherein the clip bond extends over the second electrical component.

3. The semiconductor device of claim 1, further including a conductive paste deposited between the clip bond and a surface of the first electrical component, wherein the conductive paste is at least partially disposed within the first recess or second recess.

4. A semiconductor device, comprising:
a leadframe;
a first electrical component disposed over the leadframe; and
a clip bond disposed over the first electrical component, wherein a first thickness of the clip bond in a range of 0.002-0.022 mm proximate to directly above a first distal end of the first electrical component is less than a second thickness of the clip bond in a range of 0.047-0.067 mm proximate to directly above a second distal end of the first electrical component opposite the first distal end of the first electrical component.

5. The semiconductor device of claim 4, wherein the clip bond includes a third thickness over a surface of the first electrical component, wherein the third thickness is different from the first thickness and second thickness.

6. The semiconductor device of claim 5, further including a second electrical component disposed over the leadframe, wherein the clip bond extends over the second electrical component.

7. The semiconductor device of claim 6, wherein the clip bond includes a fourth thickness over a surface of the second electrical component, wherein the fourth thickness is different from the first thickness and second thickness.

8. The semiconductor device of claim 4, further including a conductive paste deposited between the clip bond and a surface of the first electrical component.

9. The semiconductor device of claim 4, further including an encapsulant deposited over the clip bond and first electrical component.

10. A method of making a semiconductor device, comprising:
providing a leadframe;
disposing a first electrical component over the leadframe; and
disposing a clip bond over the first electrical component by forming a first recess proximate to a first distal end of the first electrical component, and forming a second recess proximate to a second distal end of the first electrical component opposite the first distal end of the first electrical component, wherein a depth of the first recess in a range of 0.215-0.235 mm measured vertically from a top surface of the first electrical component to a first bottom surface of the clip bond directly above the first distal end of the first electrical component is greater than a depth of the second recess in a range of 0.170-0.190 mm measured vertically from the top surface of the first electrical component to a second bottom surface of the clip bond directly above the second distal end of the first electrical component.

11. The method of claim 10, further including disposing a second electrical component disposed over the leadframe, wherein the clip bond extends over the second electrical component.

12. The method of claim 10, further including depositing a conductive paste between the clip bond and a surface of the first electrical component, wherein the conductive paste is at least partially disposed within the first recess or second recess.

13. The method of claim 10, further including depositing an encapsulant over the clip bond and first electrical component.

14. The method of claim 11, wherein a first thickness of the clip bond directly above the first distal end of the first electrical component is less than a second thickness of the clip bond directly above the second distal end of the first electrical component opposite the first distal end of the first electrical component.

15. The method of claim 14, wherein a third thickness of the clip bond directly above the first electrical component is different from the first thickness and second thickness and a fourth thickness of the clip bond directly above the second electrical component is different from the first thickness and second thickness.

16. The semiconductor device of claim 2, wherein a first thickness of the clip bond directly above the first distal end of the first electrical component is less than a second thickness of the clip bond directly above the second distal end of the first electrical component opposite the first distal end of the first electrical component.

17. The semiconductor device of claim 16, wherein a third thickness of the clip bond directly above the first electrical component is different from the first thickness and second thickness and a fourth thickness of the clip bond directly above the second electrical component is different from the first thickness and second thickness.

* * * * *